United States Patent
El Sabahy et al.

(10) Patent No.: US 12,336,241 B2
(45) Date of Patent: Jun. 17, 2025

(54) MANUFACTURING METHOD OF A NANOWIRE-BASED STRUCTURE AND CAPACITOR ARRAY COMPONENT INCLUDING THE STRUCTURE

(71) Applicants: Murata Manufacturing Co., Ltd., Nagaokakyo (JP); COMMISSARIAT A L'ENERGIE ATOMIQUE ET AUX ENERGIES ALTERNATIVES, Paris (FR)

(72) Inventors: Julien El Sabahy, Grenoble (FR); Frédéric Voiron, Barraux (FR); Guy Parat, Grenoble (FR)

(73) Assignees: MURATA MANUFACTURING CO., LTD., Nagaokakyo (JP); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 376 days.

(21) Appl. No.: 17/698,240

(22) Filed: Mar. 18, 2022

(65) Prior Publication Data
US 2022/0208968 A1    Jun. 30, 2022

Related U.S. Application Data

(63) Continuation of application No. PCT/EP2020/075860, filed on Sep. 16, 2020.

(30) Foreign Application Priority Data

Sep. 19, 2019 (EP) ...................... 19306136

(51) Int. Cl.
| | | |
|---|---|---|
| H10D 62/10 | (2025.01) | |
| H01L 21/02 | (2006.01) | |
| H01L 23/522 | (2006.01) | |

(52) U.S. Cl.
CPC ..... *H10D 62/122* (2025.01); *H01L 21/02603* (2013.01); *H01L 23/5223* (2013.01)

(58) Field of Classification Search
CPC ................ H01L 23/5223; H01L 29/90; H01L 21/02603; Y02E 60/13; H01G 4/306;
(Continued)

(56) References Cited

U.S. PATENT DOCUMENTS 9,359,195 B2 *  6/2016  Mardilovich .......... C25D 11/26
2006/0214262 A1 *  9/2006  Mosley .................... H01G 4/08
                                                                257/532

(Continued)

FOREIGN PATENT DOCUMENTS

| EP | 3656734 A1 | 5/2020 |
|---|---|---|
| EP | 3680931 A1 | 7/2020 |
| WO | 2015063420 A1 | 3/2015 |

OTHER PUBLICATIONS

EP 3076450 A1 "Thin Film Capacitor" Ehara et al Oct. 5, 2016 (Year: 2016).*

(Continued)

*Primary Examiner* — Suberr L Chi
*Assistant Examiner* — William C. Trice, III
(74) *Attorney, Agent, or Firm* — ArentFox Schiff LLP (57) ABSTRACT

A nanowire structure is manufactured by forming islands of conductive material on a substrate, and a conductive sacrificial layer in the space between conductive islands. The conductive islands include an anodic etch barrier layer. An anodizable layer is formed, over the conductive islands and sacrificial layer, and anodized to form a porous template. Nanowires are formed in regions of the porous template that overlie the conductive islands. Removal of the porous template and sacrificial layer leaves a nanowire structure including isolated groups of nanowires connected to respective (Continued)

conductive islands which function as current collectors. Respective stacks of conductive and insulator layers are formed over different groups of the nanowires to form respective capacitors that are electrically isolated from one another. A monolithic component may thus be formed including an array of isolated capacitors formed over nanowires.

2 Claims, 10 Drawing Sheets

(58) Field of Classification Search
CPC .......... H01G 4/33; H01G 4/38; H01G 4/012; H01G 9/04; H01G 9/048; C25D 1/006; C25D 1/04; C25D 11/022; C25D 11/045; H10D 62/122; H10D 1/716
See application file for complete search history.

(56) References Cited

U.S. PATENT DOCUMENTS

| | | |
|---|---|---|
| 2008/0210662 A1 | 9/2008 | Rabin et al. |
| 2011/0053794 A1 | 3/2011 | Zhang |
| 2016/0268144 A1 | 9/2016 | Voiron et al. |

OTHER PUBLICATIONS

International Search Report issued for PCT/EP2020/075860, date of mailing Dec. 21, 2020.
Banerjee, P. et al.; "Nanotubular metal-insulator-metal capacitor arrays for energy storage"; Nature Nanotechnology, Nature Pub. Group, Inc, London, vol. 4, No. 5, Jan. 1, 2009, pp. 292-296.
European Search Report issued for EP Application No. 19 30 6136, date of completion of the search Feb. 4, 2020.

* cited by examiner

MANUFACTURING METHOD OF A NANOWIRE-BASED STRUCTURE AND CAPACITOR ARRAY COMPONENT INCLUDING THE STRUCTURE

CROSS REFERENCE TO RELATED APPLICATIONS

The present application is a continuation of International application No. PCT/EP2020/075860, filed Sep. 16, 2020, which claims priority to European Patent Application No. 19306136.3, filed Sep. 19, 2019, the entire contents of each of which are incorporated herein by reference.

FIELD OF THE INVENTION

The present invention relates to the field of integration and, more particularly, to methods of manufacturing integrated nanowire-based structures and multi-capacitor components integrating such nanowire-based structures, as well as to capacitor array components manufactured using such methods.

TECHNICAL BACKGROUND

Techniques have been developed for integrating passive components in silicon. For example, the PICS technology developed by Murata Integrated Passive Solutions enables the integration of high-density capacitive components into a silicon substrate. According to this technology, tens or even hundreds of passive components can be efficiently integrated into a silicon die.

In their work titled "Nanotubular metal-insulator-metal capacitor arrays for energy storage" (published in Nature Nanotechnology, vol. 4, no5, pp292-26, May 2009), P. Banerjee et al. describe a metal-insulator-metal (MIM) structure formed in a porous anodic material, such as porous anodic alumina (AAO) for example. The successive layers of metal, insulator, and then metal follow the contours of the porous material conformally, resulting in the MIM structure being embedded inside the pores of the porous material.

Architectures as described above may be produced by the embedding of a structure (e.g., a MIM structure or, more generally, an EIE structure comprising electrode (E) and insulator (I) layers) inside a porous region formed above a substrate, such as a silicon wafer. Typically, the porous region results from anodizing a layer of metal, such as aluminum, deposited above the substrate. The anodization converts the metal layer into porous anodic oxide (e.g. porous alumina, otherwise known as porous AAO, with AAO standing for "anodic aluminum oxide"). Typically, a hard mask is formed on top of the anodizable metal layer before anodization, and the hard mask defines a chosen shape and size for the periphery of the porous region as viewed from the top. The remainder of the anodizable layer, which is shielded from the anodization electrolyte by the hard mask, does not undergo anodization.

Banerjee's AAO embedded structure suffers from high Equivalent Series Resistance (ESR) and limited capacitance density due to the limited AAO thickness that can be deposited by Atomic Layer Deposition (ALD).

A structure by F. Voiron et al. that improves Banerjee's ESR and capacitance is described in international application publication WO 2015/063420 A1. Voiron's structure results in highly integrated capacitance that may be used in a variety of applications. In this structure the bottoms of the pores are opened and the lower metal layer of the MIM structure contacts a conductive layer that underlies the porous region, providing electrical contact and reducing ESR.

In order to further improve capacitance density together with lowering ESR, a structure comprising nanowires has been proposed in the applicant's pending European patent application no. 18 306 565.5. An EIE structure is deposited over the nanowires to form an integrated passive device, notably, a capacitance. An IE structure may be deposited over the nanowires in a case where the nanowires themselves constitute the lower electrode. In the devices described in EP 18 306 565.5, one or more lateral bridge layers interconnect the nanowires. The lateral bridges help to ensure the mechanical strength of the structure and help to ensure that the nanowires are evenly spaced from one another. In the case of employing this nanowire structure it is easier to form the IE or EIE layers so that they have uniform properties (e.g. uniform thickness) because during the layer-deposition process the gaseous species diffuse more readily through the nanowire structure than they can diffuse in the case of a porous structure where the pores have a high aspect ratio.

There are various applications where it is necessary to make use of multiple capacitors. For example, in the case of an analog mixed-signal System On a Chip (SOC), capacitive decoupling is needed for multiple independent voltage domains (such as, for example, digital and analog domains). Another example is the case of implantable monitoring devices as cerebral/cardiac sensing units where capacitors are used as security elements to block DC biasing of the biological tissue. In such devices, a respective capacitor is connected in series to each electrode carrying a biological electric signal (e.g. nerve signal). Typically, there may be 4 electrodes in the case of cardiac sensing or up to 46 electrodes in the case of cerebral sensing, which implies use of a large number of capacitors.

Advantages can be obtained by integrating multiple capacitors in a common component. For example, in the case where multiple domains cohabit on a single SOC, by integrating multiple decoupling capacitors into a common capacitive component this makes the assembly process of the SOC simpler. Indeed, this reduces the amount of component-handling operations that are required, reduces the risk of flaws during assembly and improves the overall reliability of the system.

In the case of an analog mixed signal SOC there are stringent constraints on power domain isolation: i.e. GND and VSS must be separated for both analog and digital domains. Therefore, decoupling capacitors operating in each domain must be isolated from the others. In the case of implantable monitoring devices, a very high level of isolation must be implemented in between adjacent capacitive elements to prevent crosstalk between the different signal channels.

It is possible to construct a monolithic capacitor array exploiting the architecture proposed in WO 2015/063420 and comprising multiple distinct capacitors that are isolated from one another. For example, WO 2015/063420 proposes the compartmentalization of different groups of pores using insulative anodic oxide surrounding the periphery of a group of pores and insulating strips interposed underneath the open bottoms of pores at the periphery of the group. The combination of these insulating structures serves to isolate conductive structures in one group of pores from conductive structures in other groups of pores.

The applicant's pending European patent application EP 19 305 021.8 proposes another approach for constructing a monolithic capacitor array exploiting EIE layers deposited in a porous anodic oxide matrix, with individual capacitors being isolated from one another. According to this approach, there are openings in the conductive anodic etching barrier layer, and in regions corresponding to the openings either there is no anodization (because it is desired to form a conductive via at the relevant location) or a layer of insulation is provided above the substrate.

However, it may be desirable to construct a monolithic capacitor array exploiting the nanowire-based architecture proposed in EP 18 306 565.5. The manufacturing process described in EP 18 306 565.5 itself would not produce isolation between different capacitors in the array, in view of the fact that a common metallic layer is provided underneath the nanowires and extends all over the substrate. This common metallic layer operates as an anodic etch barrier layer and is necessary as a seed layer for growing the nanowires. In the finished structure, this common metallic layer would constitute a common electrode interconnecting the nanowires of different capacitors formed over the nanowires.

The present invention has been made in the light of the above problems.

SUMMARY OF THE INVENTION

Embodiments of the present invention provide a multi-capacitor component integrating an array of nanowires and incorporating a plurality of mutually-isolated capacitors on a common substrate, and its corresponding manufacturing process, as well as a method of manufacturing a nanowire-based structure.

The present invention provides a method of manufacturing a nanowire-based structure, the method comprising: forming islands of conductive material on a substrate, with a space between adjacent islands, said islands of conductive material comprising anodic etch barrier material; forming a conductive sacrificial layer on the substrate in the space between adjacent islands of conductive material; forming an anodizable layer on the islands of conductive material and on the sacrificial layer; anodizing the anodizable layer to form a porous anodic oxide template having first regions, where pores of the porous template overlie the islands of conductive material, and a second region where pores of the porous template overlie the sacrificial layer; forming, inside pores of the porous template in the first regions, nanowires having first ends that contact the conductive material and second ends that extend away from the conductive material; and removing the porous template and the sacrificial layer.

In embodiments of manufacturing methods according to the present invention, the sacrificial layer is used in combination with a patterned anodic etch barrier layer in order to produce nanowires that are connected to electrically-conductive regions on a substrate. These nanowires are arranged in groups; nanowires within a same group are commonly interconnected and different groups of nanowires become electrically isolated from one another after their production. The sacrificial layer is configured to facilitate growth of anodic oxide (e.g. AAO) as well as deposition of the nanowires, before being removed to obtain electrical isolation between the groups of nanowires.

In the above-mentioned method, the sacrificial layer may be formed to cover at least a first threshold distance between adjacent islands of conductive material. The first threshold distance may be set to assure that there will be sufficient isolation between adjacent capacitors formed on the adjacent conductive islands.

In the above-mentioned method, the sacrificial layer may having a first portion located in the space between adjacent islands of conductive material and a second portion overlying an edge of an island of conductive material adjacent to said space, and the length of the second portion of the sacrificial layer may be equal to or greater than a second threshold distance. The length of the second threshold distance affects the physical spacing, and thus the isolation, achievable between adjacent capacitors that may be formed on the respective adjacent islands.

In the above-mentioned method, the sacrificial layer and the anodizable layer may be formed of the same material and deposited in a common step. In this case the number of steps involved in the manufacturing process can be reduced. Also, in such a case it may be possible to remove the porous template and the sacrificial layer in a common process step, further reducing the number of steps in the manufacturing method.

The method may comprise forming a first lateral bridge layer that laterally interconnects a number of the nanowires that are connected to a common island of conductive material, to provide a substantially uniform spacing between these nanowires.

The present invention further provides a method of manufacturing a multi-capacitor component, the method comprising any one of the above-mentioned methods of manufacturing a nanowire-based structure, wherein different groups of the nanowires in the nanowire-based structure contact different islands of conductive material, and each island of conductive material performs the function of a current collector for its group of contacting nanowires, and further comprising forming, on different groups of nanowires, capacitive stacks that are electrically isolated from one another.

This method makes it possible to fabricate a monolithic (integrated, or stand-alone) component which includes an array of isolated capacitors formed over nanowires, thus obtaining the various benefits that derive from use of the nanowires, for example in terms of facilitating the formation of electrode and insulator layers of uniform thickness, and so on.

In the above-mentioned method, the forming of the capacitive stacks may comprise depositing insulator layers and electrode layers over the nanowires and etching the top electrode layer to ensure electrical insulation between adjacent capacitive stacks. Contacts to the top electrodes and the bottom current collectors of the respective conductive stacks may be made, and a passivation layer may be formed to encapsulate the substrate surface, the passivation layer having openings above each contact such as to expose capacitor terminals.

The present invention yet further provides a capacitor array component comprising a nanowire structure, the nanowire-structure comprising: a plurality of islands of conductive material provided on a substrate; and conductive nanowires each having a first end that contacts an island of conductive material and a second end that extends away from the island of conductive material; wherein different groups of the nanowires contact different islands of conductive material, and each island of conductive material comprises an anodic etch barrier layer and performs the function of a current collector for its group of contacting nanowires; and wherein a first stack of insulating and conductive layers is formed on a first group of nanowires contacting a first island of conductive material to form a first capacitor, and a second stack of insulating and conductive layers is formed on a second group of nanowires contacting a second island of conductive material to form a second capacitor electrically isolated from said first capacitor.

In the above-mentioned structure, a first lateral bridge layer may be provided that laterally connects a number of the nanowires that are connected to a common island of conductive material, to provide a substantially uniform spacing between said nanowires. The first lateral bridge layer may take any of the forms described in the applicant's co-pending application EP 18 306 565.5, the content of which is incorporated herein by reference, in its entirety. Thus, the first lateral bridge layer may comprise lateral extensions that laterally connect at least some of the nanowires in a group via their outer walls, and/or a capping layer (continuous, semi-continuous or discontinuous) that interconnects the free ends of nanowires in a group. Likewise, an isolation side wall of the type discussed in EP 18 306 565.5 may be provided around a group of nanowires.

BRIEF DESCRIPTION OF THE DRAWINGS

Further features and advantages of the present invention will become apparent from the following description of certain embodiments thereof, given by way of illustration only, not limitation, with reference to the accompanying drawings in which:

FIGS. 2A through 2P are a series of diagrams illustrating a first method of manufacturing a multi-capacitor component incorporating a nanowire structure, in which FIGS. 2A to 2P illustrate different steps in the method;

FIGS. 4A through 4G are a series of diagrams illustrating a first method of manufacturing a multi-capacitor component incorporating a nanowire structure, in which FIGS. 4A to 4G illustrate different steps in the first part of the method;

FIGS. 5A and 5B show examples of scanning electron microscopy (SEM) images of a structure in which nanowires are embedded in a porous AAO template and illustrate the formation of a lateral isolation trench (in which an isolation sidewall may be provided), in which:

DETAILED DESCRIPTION OF EXAMPLE EMBODIMENTS

Embodiments of the present invention address the deficiencies of the prior art by providing nanowire structures that enable formation of a multi-capacitor component in which individual capacitors are isolated from one another. A multi-capacitor component may be produced by forming stacks of insulator and electrode layers are over groups of the nanowires. The formation of the capacitive stacks over nanowires, which provide a highly open geometry, makes the proposed structures well-suited for the deposition of electrode and insulator layers of the capacitive stacks. The preferred nanowire structures provide additional advantages in terms of higher stress tolerance, and consequently make it possible to achieve improved ESR/ESL (equivalent series inductance) and EPC (equivalent capacitance density).

Figure 1:
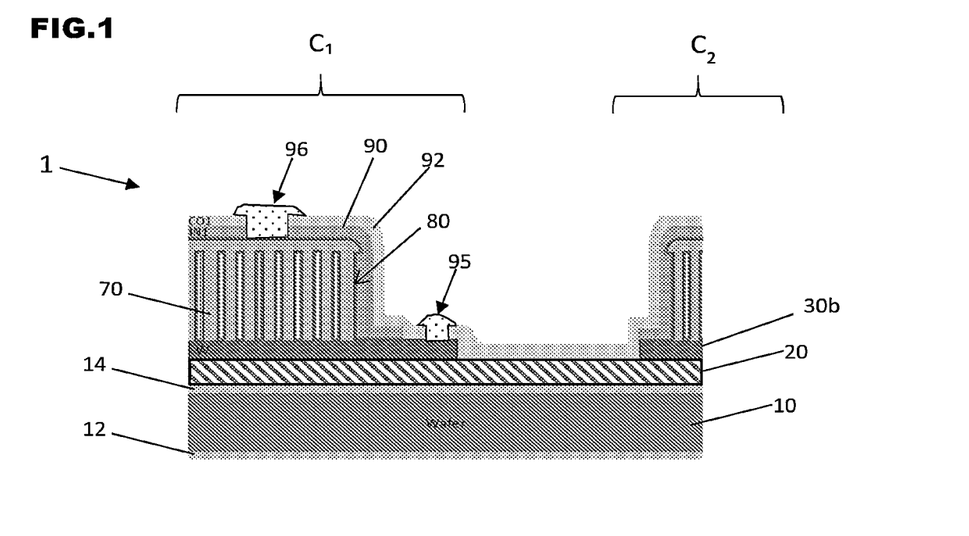
FIG. 1 is a diagram which schematically represents a cross-section through a multi-capacitor component according to an embodiment of the present invention.

More particularly, a first embodiment of the present invention provides a multi-capacitor component 1 as illustrated in FIG. 1.

As illustrated in FIG. 1, the example multi-capacitor component 1 comprises two capacitors, $C_1$ and $C_2$, which are electrically isolated from one another but integrated into the same component (i.e. mounted on the same substrate). It will be understood that multi-capacitor components according to the invention can include a number of capacitors different from two (e.g. three, four, five, and so on) as desired.

In the example illustrated in FIG. 1, the multi-capacitor component incorporates a substrate 10-20 which includes a silicon wafer 10, a thermal silicon dioxide layer 12 formed on the underside of the wafer, a thermal silicon dioxide layer 14 formed on the upper side of the wafer and an insulating layer 20 formed on the thermal silicon dioxide layer 14. In this example the electrically-insulating layer 20 is interposed between the wafer 10 and the barrier layer 30. There are various suitable materials for making the electrically-insulating layer 20. Some examples include, but are not limited to: SiN. Various techniques may be used for forming the electrically-insulating layer 20 on the substrate including, but not limited to: PECVD, CVD, electrochemical wet deposition, etc. Of course, the materials forming the substrate 10-20 may be varied.

Islands of conductive material 30a, 30b are provided on the insulating layer 20. In this example the conductive islands 30a, 30b are formed of anodic etch barrier material, that is, a material which hinders onward progression of anodization towards the underlying substrate 10-20. The anodic etch barrier material may achieve this function by virtue of its formation of an oxide, during anodization, the oxide serving as a barrier to subsequent progression of anodization. A variety of different materials are suitable for use as the anodic etch barrier material including, but not limited to: tungsten, titanium, tantalum and molybdenum.

Nanowires 70 are connected, in groups, to the different conductive islands 30a, 30b. The nanowires may be made of conductive material. The conductive nanowires may be made out of a variety of different materials including, but not limited to: graphene, silicon, nickel and copper.

The nanowires connected to a given island of conductive material are enrobed by a respective stack of layers 80 forming a capacitive structure. In the case of use of conductive nanowires, the capacitive stack may by an IE stack, i.e. an insulator layer (I) conformally coated over the nanowires and an electrode layer (E) conformally coated on the insulator layer. The IE layers form, with the conductive nanowires, an EIE structure corresponding to a capacitor ($C_1$ or $C_2$ in FIG. 1). If desired, and space permits, a repeated stacked structure may be formed, i.e. EIEIE, or EIEIEIE, and so on. Any suitable materials may be used to make the electrode layers and the insulator layers. Some examples of suitable materials for the electrode layers include, but are not limited to: a metal, semi-metal or other conductor material, or a combination of a conductor and an oxide. Some examples of suitable materials for the electrode layers include, but are not limited to: a dielectric, such as an ionic dielectric or a dielectric selected from the family of paraelectric or ferroelectric materials.

Multi-capacitor components according to the present invention may be formed on substrates of various kinds. Indeed, the conductive islands 30a, 30b may be formed on a substrate that might be conductive or insulating. As another example, thermal silicon oxide layers 12 and 14 are optional and may be omitted. Likewise, if substrate 10 in FIG. 1 is insulative then the conductive islands 30a, 30b may be formed directly thereon, i.e. insulative layer 20 may be omitted. The substrate itself may be an intermediate product in the fabrication of an integrated circuit and so may incorporate the usual metallization layers and interlayer insulation layers that are commonly provided in integrated circuit manufacture, as well as integrated circuit components. In the example illustrated in FIG. 1 a patterned layer 90 forms a first conductive layer (IN1 level), in this case made of aluminum. A passivation layer 92 forms a CO1 layer encapsulating the capacitors and the substrate surface (here, the surface of insulator layer 14). The multi-capacitor component 1 includes contacts to the top and bottom electrodes of the various capacitors, made of a conductive material (IN2). FIG. 1 illustrates a contact 95 to the bottom electrode of capacitor C1 and a contact 96 to the top electrode of capacitor C1, these contacts being provided in openings through the layers 90 and 92.

In one typical implementation of the component of FIG. 1, the various layers are dimensioned, as follows:
layer 10: thickness of standard Si wafers
each of the thermal silicon dioxide layers 12, 14 (if present): a few hundred nanometers
insulating layer 20: from a few 100 nm to a few microns
anodic etch barrier layer 30:
first conductive layer 90:1 micron
passivation layer 92:1 micron The present invention also provides various methods of manufacturing a multi-capacitor product as described above, as well as a nanowire structure that is an intermediate product of the methods. First to third example manufacturing methods will be described below with reference to FIGS. 2A-2P, 3A-3G$_3$ and 4A-4G, respectively.

A first example manufacturing method will now be described with reference to FIGS. 2A to 2P which illustrate different steps in the method.

Figure 2A:
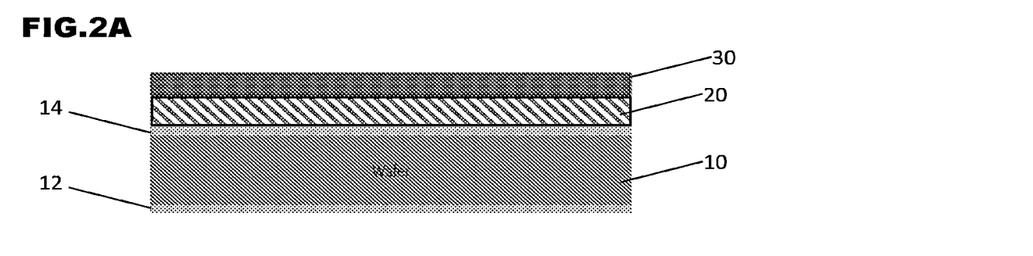

As illustrated in FIG. 2A, a conductive layer 30 is formed over the above-described substrate 10-20. In this example the conductive layer consists of an anodic etch barrier layer 30, but additional layers may be provided interposed between the anodic etch barrier layer and the underlying substrate 10-20 (for instance, the conductive layer 30 may be formed of an etch-barrier layer overlying a layer of a more highly-conductive material that helps to reduce ESR in the capacitors). The barrier layer 30 may be made of a material which has the property of forming, during anodization of an overlying metal layer, an oxide which can be etched selectively with respect to the anodic oxide formed by anodization of the overlying metal layer. The material of the barrier layer 30 has sufficient electrical conductivity that it permits the anodization process to take place. There are various suitable materials for making the barrier layer. Some examples include, but are not limited to: tungsten, and valve metals (e.g. titanium, tantalum, TiN, TaN, etc.). Various techniques may be used for forming the barrier layer 30 on the substrate including, but not limited to: PVD, CVD, etc.

Figure 2B:
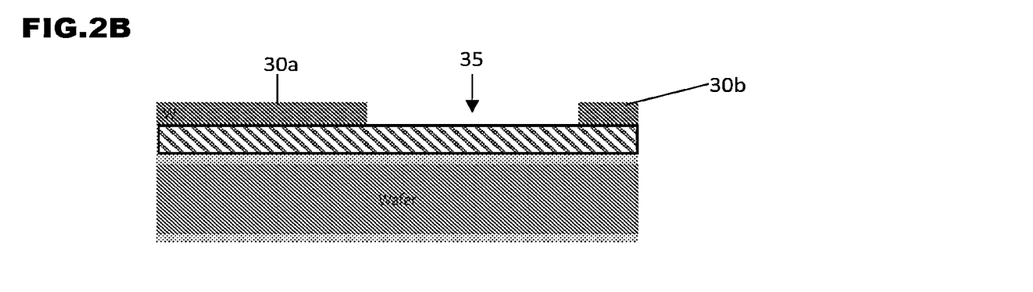

As illustrated in FIG. 2B, the conductive layer 30 is then patterned to create islands 30a, 30b which are separated from one another by one or more openings 35. The conductive layer 30 needs to be patterned in order to define zones where metallic nanowires will be formed and zones where electrical isolation will be created, as described below.

Figure 2C:
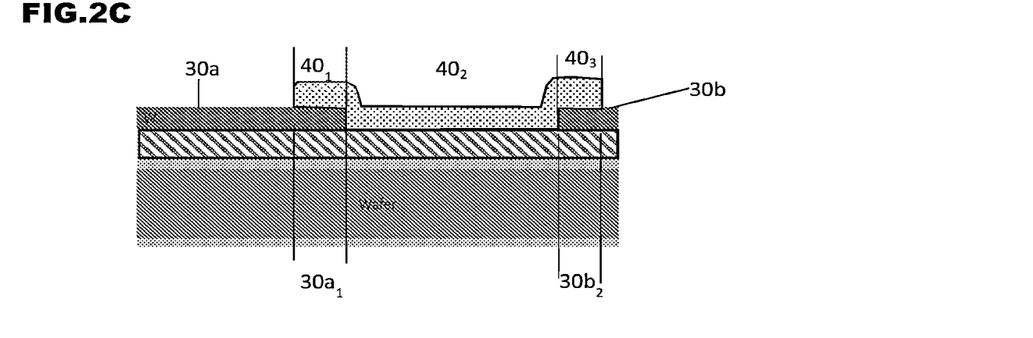

As illustrated in FIG. 2C, a sacrificial layer 40 is formed over the layer 30 and patterned. After this patterning process, the space between the islands 30a, 30b of barrier material contains sacrificial layer material 40. The patterned sacrificial layer 40 comprises conductive material to create an electrical link across the wafer and thus enhance regularity in the feeding of the anodic voltage during a subsequent anodization step.

More particularly, a first portion $40_1$ of the sacrificial layer extends between adjacent conductive islands 30a, 30b. As can be appreciated from FIG. 2E, the length $L_{ISOL}$ of this portion $40_2$ of the sacrificial layer constitutes a physical distance by which subsequently-formed capacitors will be isolated from one another.

In this example the sacrificial layer includes an additional portion $40_1$ which overlies an end $30a_1$ of the conductive island 30a, and an additional portion $40_3$ which overlies an end $30b_1$ of the conductive island 30b. In this example the length of this overlay $L_{IN}$ is set to a value which is sufficient to take into account alignment errors which may derive from limitations in lithographic processes. Typically, such limitations require a value that corresponds to typical contact size, i.e. from typically 3 μm to 100 μm.

The patterning of the barrier layer 30 and the patterning of the sacrificial layer 40 may be performed using any convenient techniques, for example well-known lithographic techniques. $L_{IN}$ and $L_{ISOL}$ define zones where bottom contact and electrical isolation between components will be achieved, respectively. They may be fully controlled by a photolithographic step. Zones A will hence be defined where pore bottoms will be open on the barrier layer 30, to the contrary of zones B where residual sacrificial-layer material will remain underneath the bottoms of the pores.

In this example the sacrificial layer 40 is a unitary metal layer, but other possibilities exist (including the possibilities discussed below with reference to FIGS. 3A-3G$_3$ and 4A-4G). Typically, the thickness of the sacrificial layer 40 is in the range from a few 100 nm up to 1 μm.

Figure 2D:
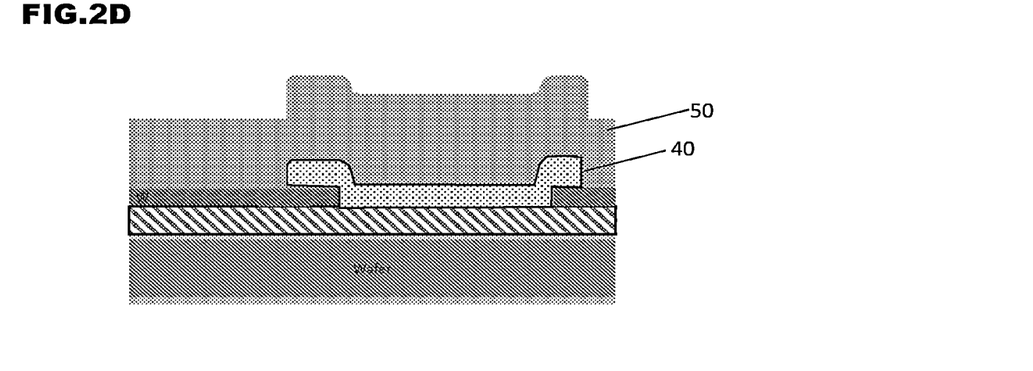

As illustrated by FIG. 2D, an anodizable layer 50 is formed over the conductive islands 30a, 30b and the sacrificial layer 40. In this example the anodizable layer 50 is made of aluminum, but it may be made of various other materials as indicated above. The anodizable layer 50 may be relatively thick, typically over 1 μm thick, for instance in the range of 4-8 μm thick. Layer 50 is preferably more than 5 μm thick. It is even more highly preferred for layer 50 to be more than 10 μm thick.

Figure 2E:
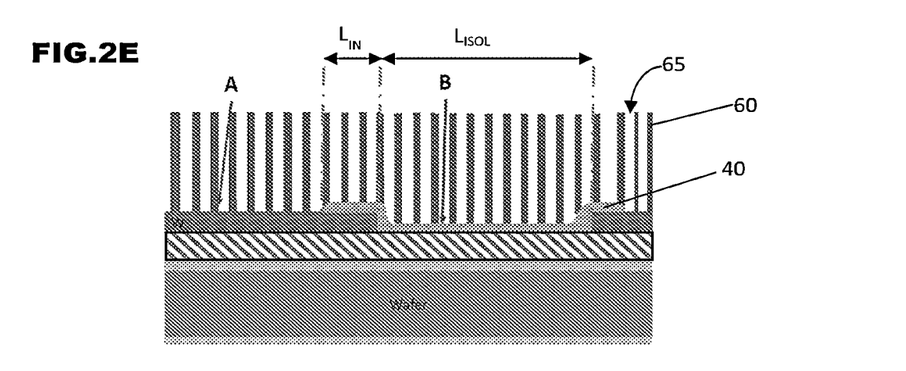

As illustrated in FIG. 2E, the anodizable layer 50 is anodized to form porous anodic oxide 60. In this example the porous anodic oxide is AAO. Any convenient anodization process may be used, for example the known two-stage process which produces a self-organized array of substantially parallel, elongated pores 65 which extend from the free surface of the anodizable material 50 towards the substrate 10-20. The porous anodic oxide 60 serves as a template in which nanowires may be formed.

The method may include a process of depositing a first hard mask above the anodizable layer 50, patterning the first hard mask to define a section of the anodizable layer; and anodizing the section of the anodizable layer defined by the first hard mask to form the anodic oxide template. The first hard mask helps localize the growth of the conductive wires within the section of the anodizable layer defined by the first hard mask. The first hard mask may be an insulating material such as silicon oxide or silicon nitride.

Figure 5A:
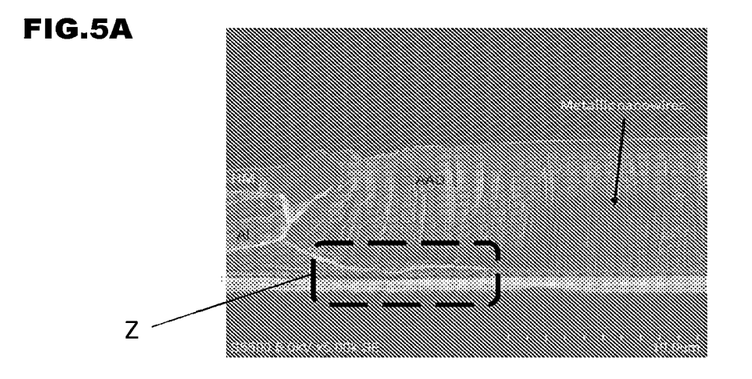
FIG. 5A shows the structure with the porous AAO template still in place.

The anodization process is controlled so that pores in the porous anodic oxide template extend all the way down to the islands of barrier material 30a, 30b, and are open at the bottom (i.e. open onto the barrier material). However, in zones at the periphery of the region of porous anodic oxide the anodization process may produce pores that are shorter than the pores at the center of the region, and so some unopened pores may be formed. Moreover, under such unopened pores there may be a residual "shelf" of anodizable material that has not been converted to oxide. This situation is illustrated in FIG. 5A, which is a scanning electron micrograph of a structure in which nanowires are formed in a porous AAO template formed in a region defined by a hard mask provided on an Al layer. A residual Al shelf at the edge of the porous anodic oxide region is surrounded by the dashed line Z in the figure.

Figure 2F:
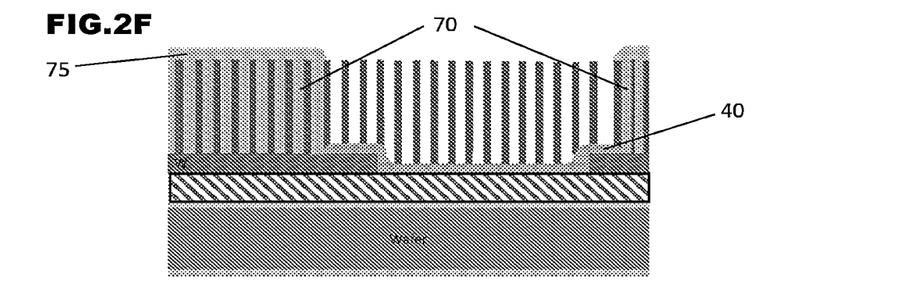
Figure 2G:
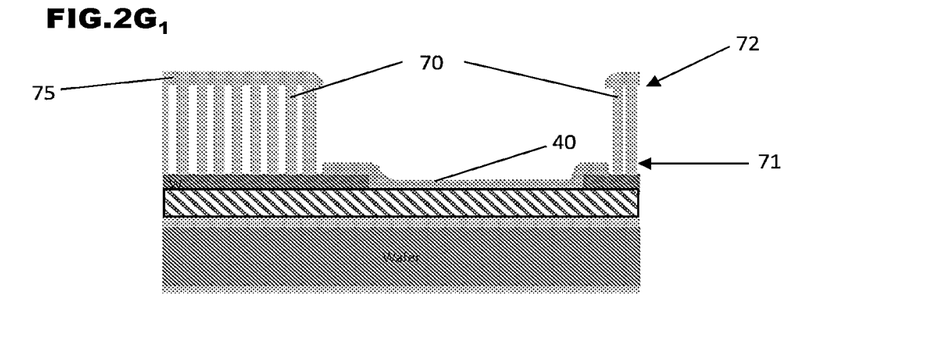
Figure 2G:
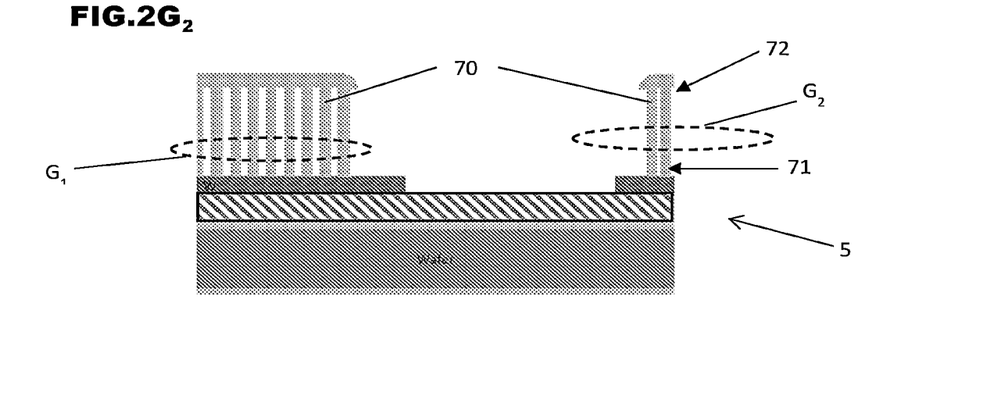

As illustrated in FIG. 2F, a process is performed to fill the pores 65 in the porous template 60 with material to form nanowires 70. Each nanowire 70 is connected at one end 71 to a respective conductive island 30a, 30b and has a free end 72 which extends away from the substrate. The nanowires may be formed by any convenient method including, but not limited to: electrochemical deposition (ECD), an electroless deposition process, deposition by sol-gel, chemical vapor deposition (CVD), or atomic layer deposition (ALD). In this example the nanowires are conductive and are made of metal, for example Ni or Cu or W. The conductive sacrificial layer 40 allows current to be fed during deposition of the metal for the nanowires, for example by an electrolytic method, but the resistivity of an oxide layer formed by anodization of the sacrificial layer at the pore bottoms is too high to permit deposition of material to form nanowires in region B of FIG. 2E.

In the example illustrated by FIG. 2F, it can be seen that there is a first lateral bridge layer 75 that laterally connects a number of the nanowires that are connected to a common island 30a of conductive material, as in EP 18 306 565.5. This first lateral bridge layer 75 helps to provide a substantially uniform spacing between the nanowires. In the example illustrated in FIG. 2F the first lateral bridge layer 75 is a capping layer and the method includes forming, on a top surface of the anodic oxide region, a capping layer that caps the second ends of at least some of the conductive wires. The capping layer may be continuous, semi-continuous, or discontinuous and may cap all or substantially all or some of the second ends of the conductive wires.

Alternatively or additionally, the anodizing of the anodizable layer may comprise varying the anodization voltage to induce lateral porous branches in the anodic oxide that connect adjacent vertical pores. A lateral bridge layer may then be formed within the created lateral porous branches. The formation of the lateral bridge layer may comprise forming lateral extensions, inside the lateral porous branches, the lateral extensions connecting laterally at least some of the conductive wires via their outer walls. In an embodiment, the conductive wires and the lateral bridge layer are grown inside the pores and lateral porous branches of the anodic oxide region.

In an embodiment, the method may comprise: depositing a second hard mask on the anodic oxide template 60, patterning the second hard mask to define a section of the anodic oxide template, and forming the nanowires inside pores of the anodic oxide template that fall within the section of the anodic oxide region defined by the second hard mask. The section of the anodic oxide region that is defined by the second hard mask may correspond to a section with pores that are fully open. The second hard mask may be made of an insulating material such as silicon oxide or silicon nitride. In certain embodiments, the second hard mask is etched prior to, or lifted off during, the dissolution of the anodic oxide template. This facilitates the dissolution of the anodic oxide and improves gas permeability through the resultant structure, especially when the area surrounding the grown conductive wires is left substantially open after dissolution of the anodic oxide.

After the nanowires (and any desired lateral bridge layers) have been formed, the porous template 60 and the sacrificial layer 40 are removed to release the nanowire structure and to isolate groups of nanowires.

In this example, as illustrated in FIG. $2G_1$, the porous template made of AAO may be dissolved in a selective etching process which is controlled to reduce etching at the interface of the anodic etch barrier layer and the conductive wires. In one embodiment, this is done by slowing down the etching process at the interface. This has the benefit of preventing or reducing electrochemical etching at the interface and results in the conductive wires being more uniform (less discontinuity and/or necking) particularly around the first ends that connect to the anodic etch barrier layer 30.

Figure 5B:
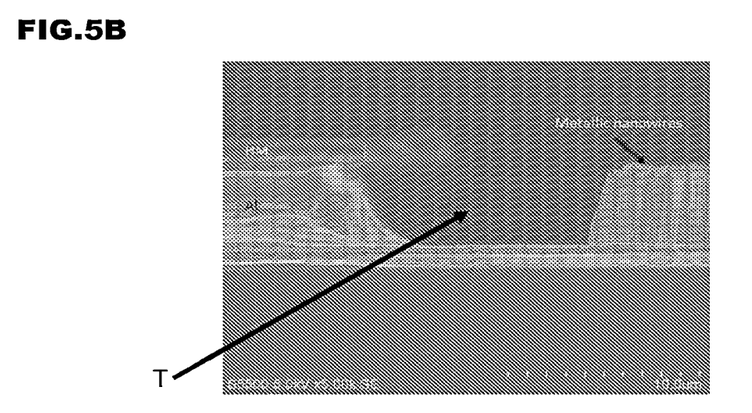
FIG. 5B shows the structure after removal of the porous AAO template.

In a case where some unopened pores were created at the periphery of the region of porous anodic oxide, the process of removing the porous anodic oxide template may create an empty trench, or void, T where the unopened pores had been situated, and may remove the shelf of residual anodizable material that had been situated near the edge of the first hard mask. This can be seen in the SEM image represented in FIG. 5B. Insulating material (not shown) may be filled into the trench T to form an isolation side wall of the type discussed in EP 18 306 565.5 around the nanowires.

As illustrated in FIG. $2G_2$, the sacrificial layer 40 is then removed (if any remains following the removal of the anodic oxide). Any convenient removal process may be employed, for example etching with an etchant appropriate to the material used to form the sacrificial layer. It may be considered that the resultant nanowire structure 5 is an intermediate product. In this product there are groups of nanowires $G_1$, $G_2$ connected to different conductive islands 30a, 30b on the substrate.

Figure 2H:
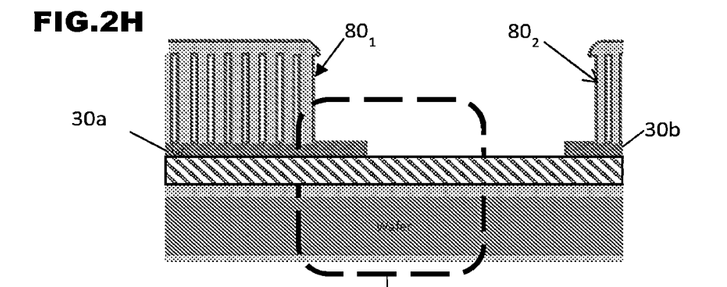
Figure 2J:
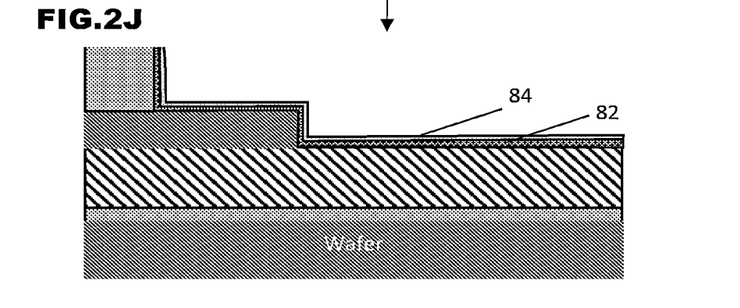

As illustrated in FIG. 2H (and in the enlarged view of part of FIG. 2H illustrated in FIG. 2J) a stack of electrode and insulator layers 80 may be coated over the nanowires. In this example, because the nanowires are conductive, the stack 80 includes an insulator layer 82 and a top electrode layer 84. In other words, an IE structure is formed over the nanowires. In other embodiments the stack 80 may include EIE layers, repeated IE layers, or repeated EIE layers, as desired. The stack of electrode and insulator layers form a capacitive structure 801 on the nanowires connected to the island 30a and a capacitive structure 802 on the nanowires connected to the island 30b. The electrode and insulator layers may be formed by any convenient process including, but not limited to, ALD.

Figure 2K:
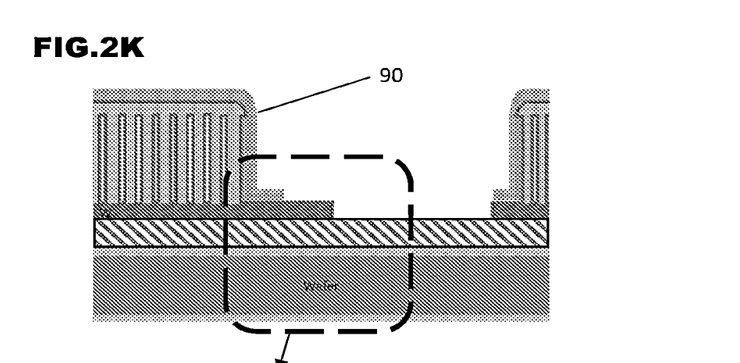
Figure 2L:
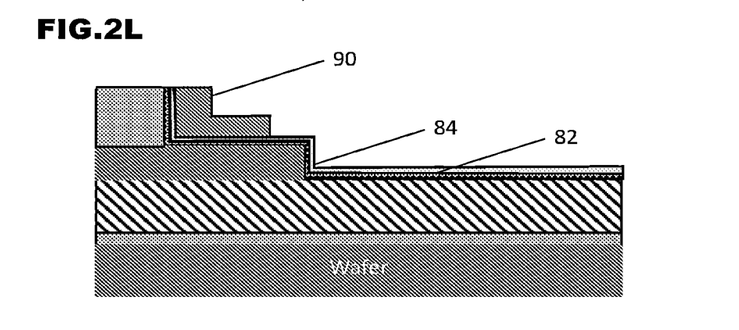
Figure 2M:
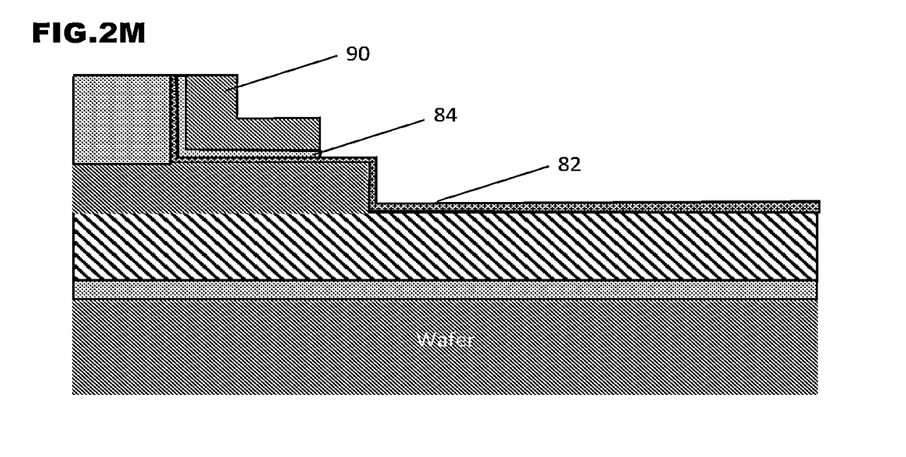

As illustrated in FIG. 2K (and in the enlarged view of part of FIG. 2K illustrated in FIG. 2L) an IN1 layer is deposited over the capacitive stacks and the exposed portions of the conductive islands and substrate, and patterned. When the distance $L_{IN}$ has been correctly set, a flat field is available. Aluminum, or another suitable material, can be deposited and hence patterned to form IN1 level. The top electrode layer 84 is then etched using the Al as a mask, to produce the structure illustrated in FIG. 2M; this isolates the individual capacitive structures provided on different conductive islands 30a, 30b from one another.

Figure 2N:
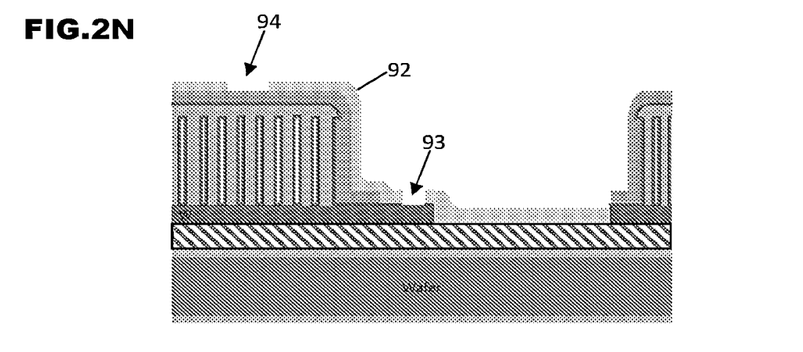

As illustrated in FIG. 2N, a CO1 layer is deposited over the structure and patterned and then oxide can be deposited and patterned. Openings are formed to accommodate contacts to the bottom and top electrodes of the capacitors, such as openings 93 and 94 in respect of capacitor $C_1$.

Figure 2P:
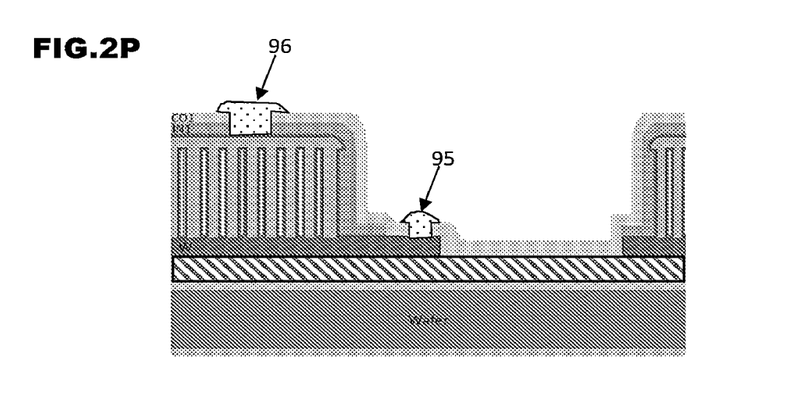

As illustrated in FIG. 2P, finally, an IN2 layer made, for example of aluminum, can be deposited and patterned to produce a multi-capacitor component 1 as illustrated in FIG. 1. Contacts are formed to the bottom and top electrodes of the capacitors, such as contacts 95 and 96 in respect of capacitor $C_1$.

As indicated above, the manufacturing method illustrated by FIGS. 2A-2P enables the fabrication of a multi-capacitor component 1 in which different capacitors are isolated from one another. The capacitance values of the individual capacitors of the component can be set as desired. For example, modifying the size of the conductive islands 30a, 30b changes the capacitance value of the capacitive structure formed over the respective island.

A second example manufacturing method will now be described with reference to FIGS. 3A to $3G_3$ which illustrate different steps in the method. In this second example manufacturing method the sacrificial layer has a laminated structure and comprises an upper layer made of an insulator and an underlying layer made of a conductor, e.g. a metal.

Figure 3A:
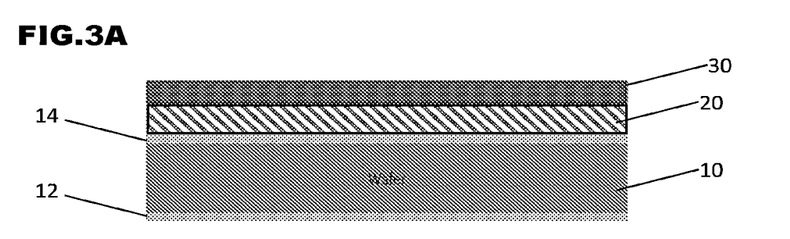
FIGS. 3A through $3G_3$ are a series of diagrams illustrating a second method of manufacturing a multi-capacitor component incorporating a nanowire structure, in which FIGS. 3A to $3G_3$ illustrate different steps in the first part of the method.
Figure 3B:
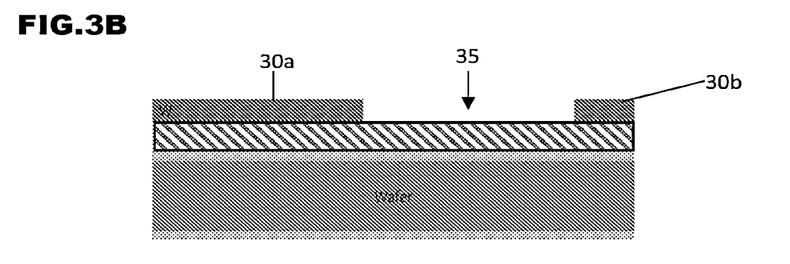
Figure 3C:
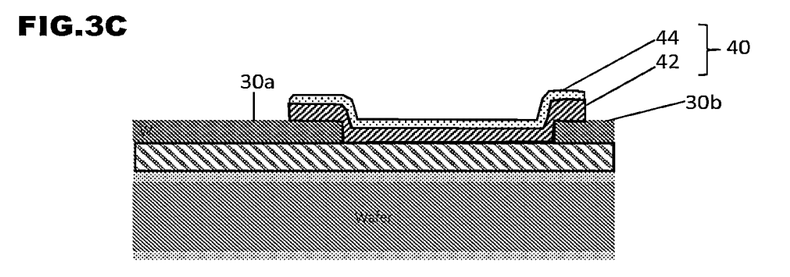

The steps of the second example method illustrated by FIGS. 3A and 3B may be the same as the steps of the first example method illustrated by FIGS. 2A and 2B. However, in the next step, illustrated by FIG. 3C, the laminated sacrificial layer 40 is used. In this example the laminated sacrificial layer 40 comprises a lower layer 42 and an upper layer 44. The upper insulating layer slows down or impedes onward progression of anodization (when anodization reaches this upper layer 44) and the underlying conductive layer ensures proper anodic voltage feeding during the anodization step. The aim of the laminated structure is to prevent subsequent anodization from consuming the conductive material 42 present in-between the conductive islands 30a, 30b. In this example, the lower layer is formed of a metal, e.g. Al, and the upper layer 44 is formed of an oxide layer like, for example, a thick alumina layer (for example an alumina layer thicker than 100 nm), or a layer of silicon dioxide or a silicon nitride layer.

Figure 3D:
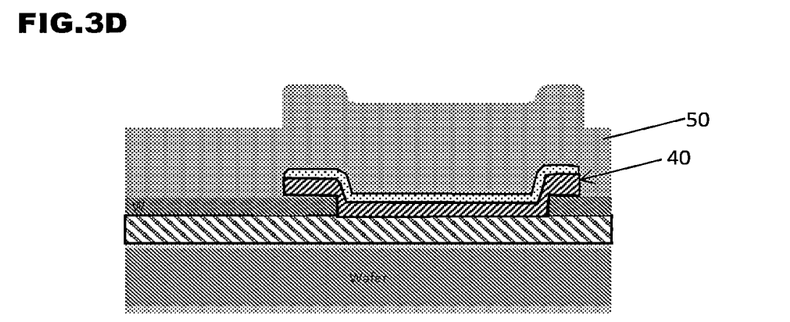
Figure 3E:
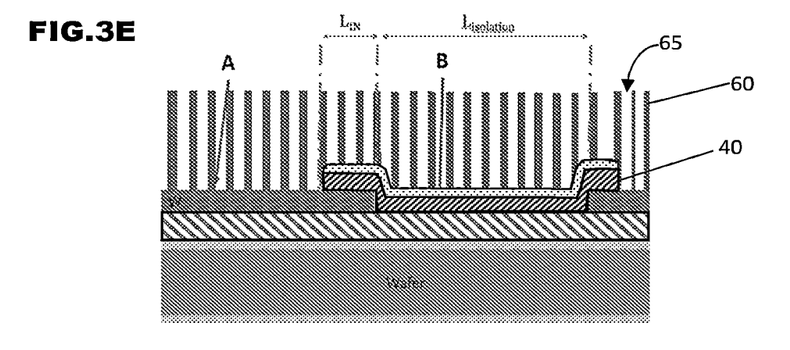

As illustrated in FIGS. 3D and 3E, a thick anodizable layer 50 is formed on the laminated sacrificial layer 40 and then anodized. In this example, in the region B which corresponds to the opening 35 between the islands 30a, 30b of barrier layer material, the anodization process stops on the insulator layer 44.

Figure 3F:
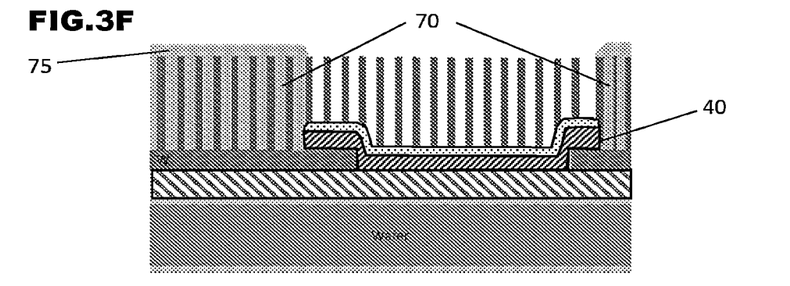

As illustrated in FIG. 3F, the porous anodic oxide template AAO is then filled with metal, using an electrolytic method for example. The conductive layer 42 in the laminated sacrificial layer allows current to be fed during metal deposition by, for example, an electrolytic method. Nanowires will simply not grow over the insulating oxide layer 44.

Figure 3G:
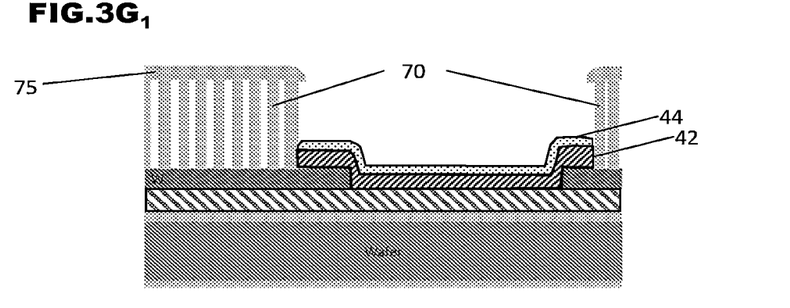

As illustrated in FIG. $3G_1$, the nanowires are released by dissolution of the porous anodic oxide template. An etchant such as phosphoric acid or diluted HF can be used as long as it is selective relative to the material forming the nanowires.

Figure 3G:
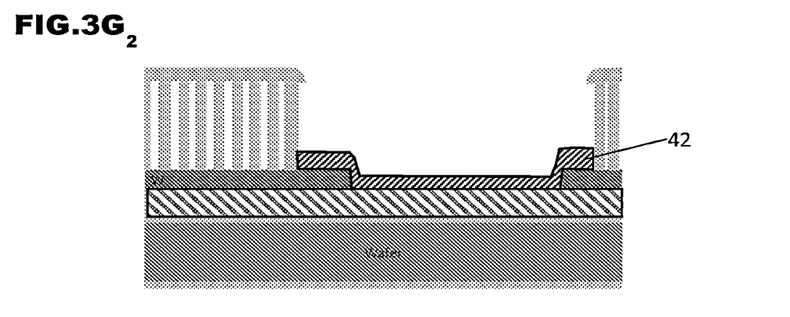
Figure 3G:
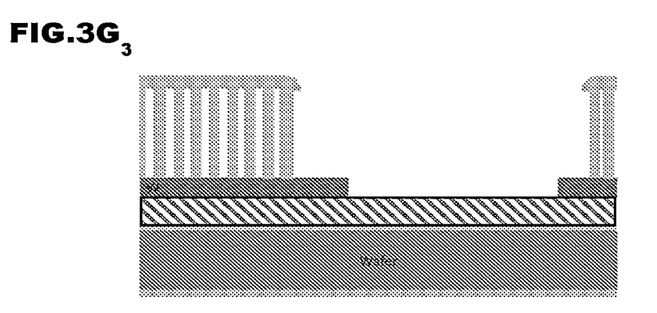

In this case of using a laminated sacrificial layer, the insulating layer 44 is then etched away after nanowire formation, as illustrated in FIG. $3G_2$, before removal of the underlying conductive layer 42. For example, in the case where the insulating layer 44 is alumina combined with a conductive layer 42 which is aluminum, an etchant such as phosphoric acid could be used. In the case of a combination of $SiO_2$ and Al, an etchant such as diluted HF can be used.

In the second example method, the subsequent steps may be the same as the steps of the first example method which are illustrated by FIGS. 2H to 2P, and so they will not be discussed further.

A third example manufacturing method will now be described with reference to FIGS. 4A to 4G which illustrate different steps in the method. In this third example manufacturing method the sacrificial layer and the anodizable layer are made of the same material. In this example, the sacrificial layer will be etched after nanowire formation and before IE (or EIE) deposition, preferably in a common etching step with dissolution of the anodic oxide template. The sacrificial layer can be deposited before or after deposition of the anodizable layer. Alternatively, the sacrificial layer and the anodizable layer may be deposited in a common process.

Figure 4A:
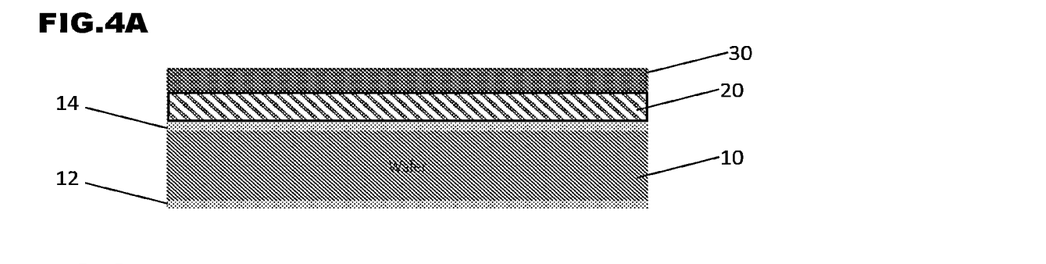
Figure 4B:
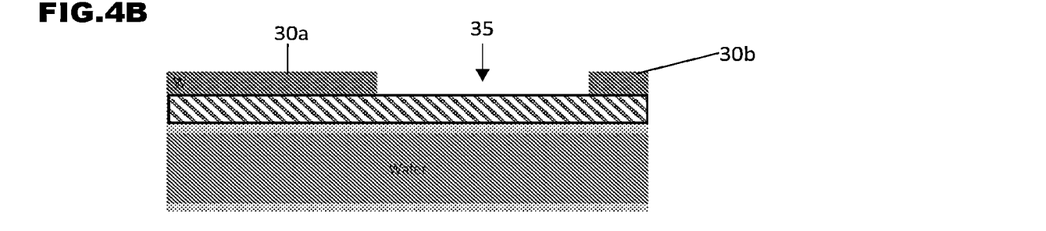
Figure 4C:
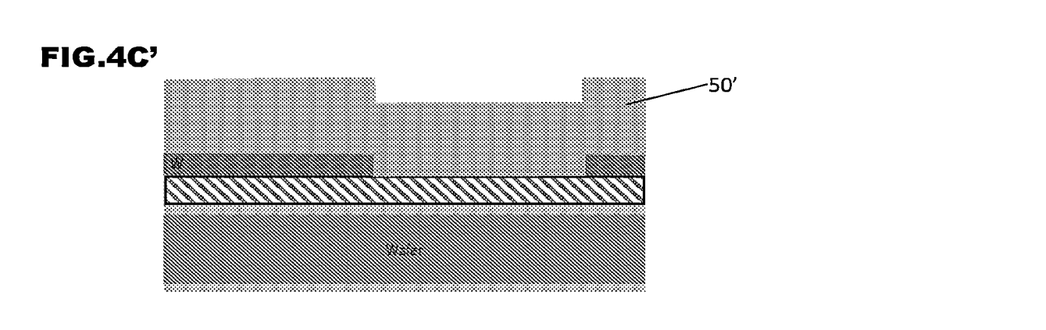
Figure 4D:
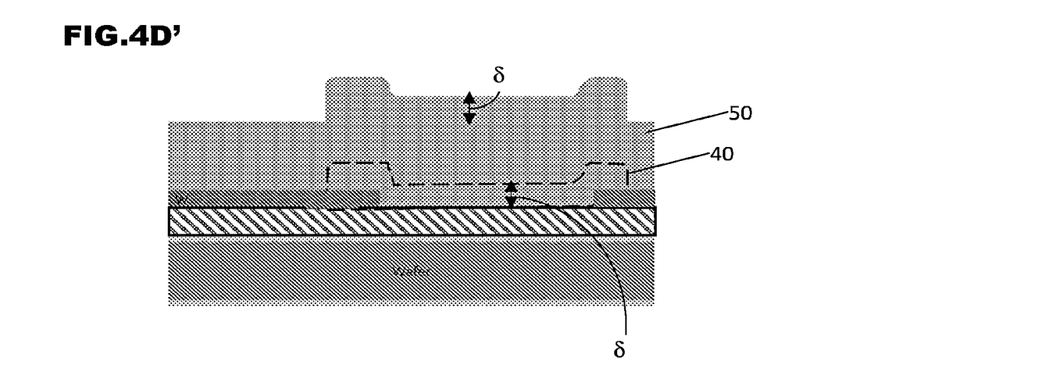

The steps of the third example method illustrated by FIGS. 4A and 4B may be the same as the steps of the first example method illustrated by FIGS. 2A and 2B. However, in the next steps, illustrated by FIGS. 4C' and 4D', a combined sacrificial layer 40 and anodizable layer 50 is formed. In the example illustrated by FIGS. 4C' and 4D', the combined sacrificial layer 40 and anodizable layer 50 is formed by first depositing, over the patterned barrier layer illustrated in FIG. 4B, a layer of anodizable material 50', as shown in FIG. 4C'. Then the layer 50' of anodizable material is patterned, by an additive or subtractive process, to produce a region of increased thickness overlying the opening 35 in the patterned barrier layer, as can be seen in FIG. 4D'. At the surface of the anodizable layer 50 a protrusion is formed that reproduces the shape of a sacrificial layer 40 as in FIG. 2C. This protrusion may have dimensions $L_{IN}$ and $L_{ISOL}$ as discussed with reference to FIG. 2E.

In regard to FIG. 4D', the protrusion at the surface of the anodizable layer 50, can be obtained by an additive process (i.e. depositing anodizable metal onto the profile shown in FIG. 4C') or a subtractive process, i.e. etching outside the recessed area visible in FIG. 4C'). The magnitude in μm of the localized thickness differential 8 that corresponds to the thickness of region $40_2$ of the sacrificial layer is set taking into account the expected growth rate of anodic oxide (in μm/hour) during the anodization process and the characteristics of the barrier layer material (for example the performance of an oxide formed in the barrier material during the anodization process. For example, it may be appropriate to set δ to a value such as 2 μm in a case where the anodizable material is made of Al, the speed of AAO growth is approximately 5 μm/h and the barrier layer material is W (such that a WOx plug is formed during the anodization process).

Figure 4E:
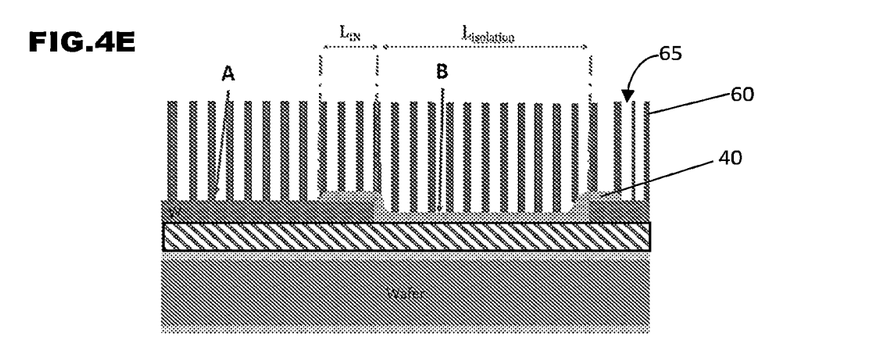
Figure 4F:
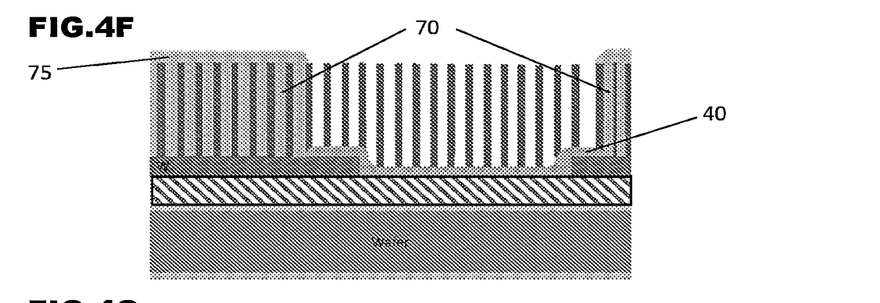

In the third example method, the steps illustrated by FIGS. 4E and 4F may be the same as the steps of the first example method that is illustrated by FIGS. 2E and 2F.

Figure 4G:
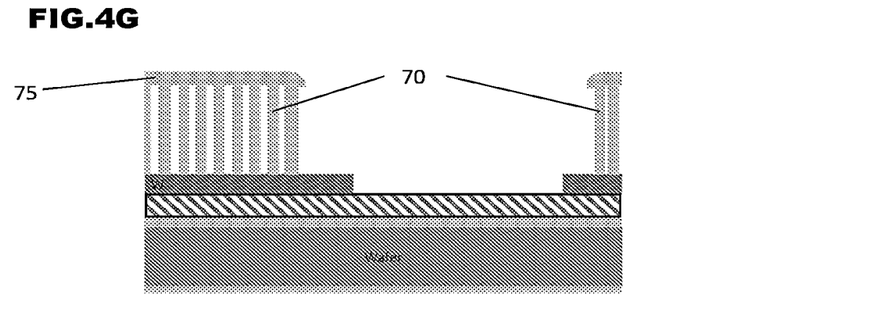

When the sacrificial layer is made of a suitable material, etching of anodic oxide to release the nanostructure and etching away of the sacrificial layer may be combined into one common step. This is the case, for example, when both the sacrificial layer and the anodizable layer are made of the same material and so may both be anodized in a common process and etched away in a common process, as illustrated by FIG. 4G. An etchant such as phosphoric acid or diluted HF can be used as long as they are selective on the material forming the nanowires.

In the third example method, the subsequent steps may be the same as the steps of the first example method which are illustrated by FIGS. 2H to 2P.

Additional Variants

Although the present invention has been described above with reference to certain specific embodiments, it will be understood that the invention is not limited by the particularities of the specific embodiments. Numerous variations, modifications and developments may be made in the above-described embodiments within the scope of the appended claims.

The invention claimed is:

1. A capacitor array component comprising a nanowire structure, said nanowire structure comprising:
    a plurality of islands of conductive material provided on a substrate; and
    conductive nanowires each having a first end that contacts an island of conductive material and a second end that extends away from the island of conductive material;
    wherein different groups of the nanowires contact different islands of conductive material, and each island of conductive material comprises an anodic etch barrier layer and performs the function of a current collector for its group of contacting nanowires;
    wherein a first stack of insulating and electrode layers is on a first group of nanowires contacting a first island of conductive material to form a first capacitor, and a second stack of insulating and electrode layers is on a second group of nanowires contacting a second island of conductive material to form a second capacitor electrically isolated from said first capacitor;
    a conductive layer covering the first capacitor;
    a passivation layer covering the conductive layer;
    a first contact in a first opening extending through the passivation layer of the first capacitor and connected to the first island of conductive material on a portion of the first island of conductive material that extends past the first group of nanowires contacting the first island of conductive material; and
    a second contact in a second opening extending through the conductive layer and the passivation layer of the first capacitor and connected to the electrode layer of the first stack.

2. The capacitor array component according to claim 1, further comprising a first lateral bridge layer that laterally connects a number of the nanowires that are connected to a common island of conductive material, to provide a substantially uniform spacing between said nanowires.

* * * * *